United States Patent
Kim

(10) Patent No.: US 7,542,343 B1
(45) Date of Patent: Jun. 2, 2009

(54) PLANAR NAND FLASH MEMORY

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 136 days.

(21) Appl. No.: 11/858,895

(22) Filed: Sep. 21, 2007

(51) Int. Cl.
*G11C 16/04* (2006.01)
(52) U.S. Cl. ............................ 365/185.11; 365/185.17; 365/185.2; 365/185.25; 365/189.05
(58) Field of Classification Search ............ 365/185.11, 365/185.17, 185.2, 185.25, 189.15, 189.05
See application file for complete search history.

(56) References Cited

U.S. PATENT DOCUMENTS

| | | | |
|---|---|---|---|
| 5,465,235 A | 11/1995 | Miyamoto | |
| 5,768,215 A * | 6/1998 | Kwon et al. | 365/238.5 |
| 5,790,458 A | 8/1998 | Lee et al. | |
| 6,826,082 B2 * | 11/2004 | Hwang et al. | 365/185.17 |
| 6,925,005 B2 * | 8/2005 | Kawamura et al. | 365/185.12 |

* cited by examiner

*Primary Examiner*—Tuan T Nguyen
*Assistant Examiner*—Toan Le

(57) ABSTRACT

Time-domain sensing scheme is introduced for reading NAND flash memory cell, wherein cell current is converted to voltage by discharging bit line, which voltage is amplified by a segment read circuit, then the voltage difference is converted to time difference by a block read circuit. In this manner, a reference signal is generated by reference cells storing low threshold data, which signal is delayed by a delay circuit for generating a locking signal. Thus the locking signal effectively rejects latching high threshold data in latch circuits because high threshold data is arrived later. Furthermore, by adopting multi-divided bit line architecture, discharging time of bit line is reduced. In addition, layout of the segment read circuit is repeatedly placed next to cell arrays in order to fabricate in the conventional planar CMOS process environment.

19 Claims, 6 Drawing Sheets

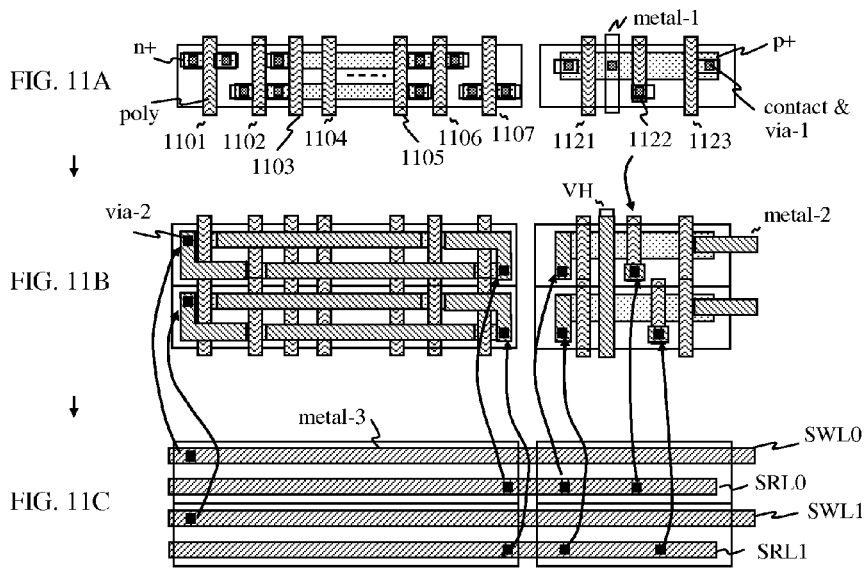
FIG. 11A
FIG. 11B
FIG. 11C
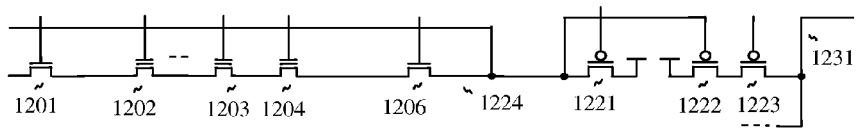
FIG. 12A
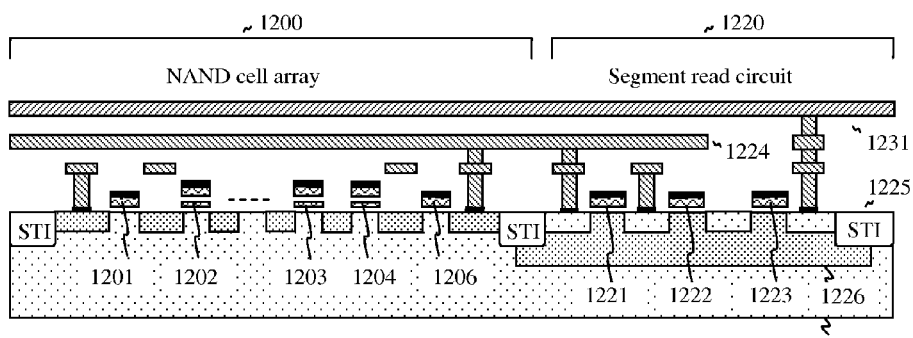
FIG. 12B

PLANAR NAND FLASH MEMORY

FIELD OF THE INVENTION

The present invention relates generally to integrated circuits, in particular to NAND flash memory including floating gate as a storage element.

BACKGROUND OF THE INVENTION

Floating gate memory device includes a charge trap region, wherein charges are stored in an isolated conductor, commonly referred to as a floating gate, in a field-effect transistor (FET) device. A memory cell operates by storing electric charge (representing either a binary "1" or "0" state of one data bit) on the floating gate, which is incorporated into a MOS (Metal-Oxide Semiconductor) field-effect transistor. The stored charges affect the threshold voltage (VT) of the transistor, thereby providing a way to read the current through the storage device.

A memory cell typically consists of a transistor, a floating gate, and a control gate above the floating gate in a stacked gate structure. The floating gate, typically composed of polycrystalline silicon (i.e., "polysilicon"), is electrically isolated from the underlying semiconductor substrate by a thin dielectric layer, which is typically formed of an insulating oxide, and more particularly, silicon oxide. This dielectric layer is often referred to as a tunnel oxide layer. The control gate is positioned above the floating gate, and is electrically isolated from the floating gate by a storage dielectric layer. Thus, the floating gate serves as a charge trap region, wherein charges are stored in the charge trap region. Other charge storage devices are constructed to store charges in insulator bulk traps in the FET device, such as MNOS (metal-nitride-oxide-semiconductor), MAOS (metal-alumina-oxide-semiconductor), MAS (metal-alumina-semiconductor), and SONOS (silicon-oxide-nitride-oxide-semiconductor) memory cells.

A programmed memory cell has its VT increased by increasing the amount of negative charge stored on the floating gate, i.e., for given source and drain voltages, the control gate voltage which allows a current to flow between the source and the drain of a programmed memory cell is higher than that of a non-programmed memory cell. Therefore, the state of a memory cell is read by applying a control gate voltage below the predetermined level corresponding to the programmed state, but sufficiently high to allow a current between the source and the drain in a non-programmed memory cell. If a current is detected, then the memory cell is read to be not programmed.

The floating gate memory, such as flash memory, can configure very high density memory. Then, the flash memory is applied to the memory of BIOS (basic I/O system) in the computer system, the memory of the communication rule etc. in a portable telephone, and the memory of the image in the digital camera, etc. as substitution of the hard disk drive.

The conventional flash memory is realized by using the sense amp in order to measure the current of the floating gate transistor. In FIG. 1A, one of prior arts for the sense amp is illustrated, as published, "A 3.3V 32 Mb NAND Flash Memory with Incremental Step Pulse Programming Scheme", IEEE Journal of Solid-State Circuits, Vol. 30, No. 11, pp 1149-1156, November 1996, and U.S. Pat. No. 6,480,419 and U.S. Pat. No. 5,790,458. Before read, pre-charge transistor 121 is turned on to set a sensing node 120 to high, and another pre-charge transistor 138 resets a latch circuit 130 including a clocked inverter 132 and an inverter 134. In order to read, pre-charge signal PRE is de-activated to high, enable signal PBENB is also de-activated to high, and latch signal LATCH is low, while select signal SLT is activated to high. Then, page selection transistors 122e and 122o connect either an even bit line BLe or an odd bit line BLo to the sensing node 120 for an access. The selected cell transistor (not shown) discharges latch node 131 through transfer transistor 126, when low threshold data is stored in the selected memory cell. Otherwise the cell transistor does not discharge the latch node 131, thus the latch keeps high. After then, the latched data is transferred to DATA LINE by Y access transistor 140.

In FIG. 1B, another circuit shows the structure of the essential portion of a NAND flash memory device, as a prior art which is published as "A Negative Vth Cell Architecture for Highly Scalable, Excellently Noise-Immune, and Highly Reliable NAND Memories", IEEE Journal of Solid-State Circuits, Vol. 34, No. 5, pp 675-684, November 1999, and U.S. Pat. No. 5,465,235. Namely a sensing circuit that is concerned with data writing and reading. For the sake of diagrammatic simplification, FIG. 1B shows each unit consisting of a plurality of NAND memory cells whose drains are commonly connected to a bit line. More specifically, each unit comprises a flip-flop circuit 151 and 152 for temporarily holding written data, a bit line BL, NAND memory cells M1 and M16, a P-channel transistor Q1 for pre-charging the bit line BL to a predetermined potential, an N channel transistor Q2 for connecting the bit line BL to the flip-flop circuit, and an N-channel transistor Q3 having both ends connected between a node of the flip-flop circuit on the opposite side to the bit line BL and a bit line side end of the transistor Q2. This transistor Q3 is provided to hold read data and then output a potential corresponding to inverted data of the read data to the bit line BL. The individual terminals of the flip-flop circuit are connected to an I/O line and a BI/O line via a column gate 154 and 155, respectively. The control signals phi.1, phi.2 and phi.3 are generated by sequential control circuit (not shown) for driving operation modes. A phi.1 signal line is connected to the gate of the transistor Q1 to control the pre-charging. A phi.2 signal line and a phi.3 signal line are respectively connected to the gate of the transistor Q2 and the gate of the transistor Q3, and are controlled at predetermined timings. The source of the transistor Q1 is connected to a power supply which provides a high supply voltage (for example, 9V) in write mode and a low supply voltage (for example, 5V) otherwise. The power supply for the flip-flop circuit 151 and 152 is provided as the same manner.

A description will now be given of the operation of copying data of a memory cell (for example, M1). It is assumed that the copying destination cell (for example, M1) has been erased previously, i.e., it has been set ON previously. First, data of the cell (for example, M1) is read out. At this time, the individual transistors of the flip-flop circuit (151 and 152) which receive clocks (not shown) are cut off and are disabled. The transistor Q2 connected to the bit line BL is set off and the transistor Q3 is also set off. Suppose that the bit line BL is pre-charged to a high level and the transistor Q2 is turned on to set the bit line BL in a free running state. After a proper time elapses, the flip-flop circuit (151 and 152) is enabled. When the potential of the bit line BL then is higher than the threshold value voltage of the flip-flop circuit, i.e., when data is written in the cell M1 and the threshold value is high, a node 153 between the bit line BL and the flip-flop circuit is set to a high level. If the cell M1 is left erased or off, the bit line BL is discharged so that the node 153 is set to a low level. This completes the reading operation. That is, the read data in the cell M1 is latched in the flip-flop circuit.

The conventional flash memory has progressed its miniaturization and as a result there arises difficulties in obtaining necessary current to measure the stored data in the memory cell. The turn-on current of the cell transistor should drive the selected bit line because the bit line is relatively long to connect multiple memory cells. And as shown in the prior arts, the latch circuit including two clocked inverters and switches is controlled by timing generator circuit (not shown) wherein the timing is generated by delay circuits typically. This means that the cell transistor should discharge the bit line within the predetermined time. And the ratio between the turn-on current and the turn-off current should be relatively high to differentiate low threshold data and high threshold data, such as several 1000 times different. When the ratio is very low, the leakage current (turn-off current) may also discharge the bit line, which may cause the sensing error because the latch node is discharged whether the threshold voltage of the cell transistor is low or high. And also the timing generation for controlling the latch is more difficult because there is no precise timing generator based on the turn-on current.

Furthermore, one of major problem is that the turn-on current through the floating gate MOS transistor is low, around 10 uA or less for the conventional flash memory, as published, "A 90-nm CMOS 1.8-V 2-Gb NAND Flash Memory for Mass Storage Applications", IEEE Journal of Solid-State Circuits. Vol. 38, No. 11, November, 2003. Even worse in the other types of floating gate memory, such as the nanocrystal memory, the drain current of the memory cell is around 1 nA or less, as published, "Metal Nanocrystal Memories—Part II: Electrical Characteristics", IEEE Transactions on Electron Devices, Vol. 49, No. 9, September, 2002. And for the single electron memory (SEM) including quantum dot, the drain current is 1.5 p~3 pA as published, "Room temperature Coulomb oscillation and memory effect for single electron memory made by pulse-mode AFM nano-oxidation process", 0-7803-4774-9/98 16.6.2 IEDM 1998.

In this respect, there is still a need to improve the floating gate memory, in order to read the cell transistor more effectively, even though the cell transistor can flow relatively low current. In the present invention, multi-divided bit line architecture is introduced to reduce the parasitic capacitance of the bit line, and a segment read circuit is added for the multi-divided local bit line. And one more major improvement is that a time-domain sensing scheme is introduced in order to differentiate low threshold data and high threshold data.

SUMMARY OF THE INVENTION

In the present invention, high-speed NAND flash memory is described. In order to achieve fast read operation, multi-divided bit line architecture is introduced, which reduces the parasitic capacitance of bit line. By reducing bit line loading, the bit line is quickly discharged when reading low threshold data, otherwise the bit line keeps the pre-charged potential when reading high threshold data. Furthermore, the current flow of the cell transistor can be reduced because the cell transistor only discharges a lightly loaded bit line, which means that the cell transistor can be miniaturized further.

Furthermore, a segment read circuit is added to detect bit line voltage. Hence, the segment read circuit transfers the cell data to a block read circuit, such that the segment read circuit serves as a amplify device and the block read circuit serves as a load device, and those circuits configure an amplifier. And then, the block read circuit detects the data and transfers the read data to the latch circuit through a read path. In particular, time-domain sensing scheme is introduced to differentiate low threshold data and high threshold data, such that a reference signal is generated by reference cells storing low threshold data, which signal serves as a locking signal for the latch circuit in order to reject latching the high threshold data because high threshold data is arrived after the low threshold data is arrived. This means that the arriving time reflects the cell current between low threshold data and high threshold data.

The read path has no phase control signals. After released from the pre-charge state by pre-charge signal, the bit line waits until a cell transistor is turned on by raising a word line and a select line. When low threshold data is selected, the cell transistor is turned on and the bit line is discharged by turn-on current of the cell transistor because the threshold voltage of the cell transistor is low. Otherwise, the bit line keeps the pre-charge state when high threshold data is selected. However, the leakage current (or turn-off current) of high threshold cell transistor discharges the selected bit line very slowly. Since low threshold data quickly discharges the selected bit line, low threshold data generates a reference signal, which is used to a locking signal for the time-domain sensing scheme. In doing so, the locking signal rejects latching high threshold data to a latch circuit, in order to differentiate low threshold data and high threshold data. Thus, low threshold data changes the latch output, while high threshold data does not change the latch output from the pre-charge state.

And a delay circuit is added for generating the locking signal from the reference signal because there is a need of adding predetermined delay time before locking the latch circuit with the statistical data for all the memory cells such as mean time between low threshold data and high threshold, in order to compensate cell-to-cell variations. Thereby the delay circuit generates a delay for optimum range of locking time, which circuit is tunable. The read output from the cell transistor is transferred to the latch circuit through a returning read path, thus the access time of the cell transistor is equal regardless of the location of the cell transistor, which is advantageous to transfer the read output to the external pad at a time.

The time-domain sensing scheme effectively differentiate low threshold data and high threshold data with time delay control, while the conventional sensing scheme is current-domain or voltage-domain sensing scheme. In the convention memory, the cell current is converted to voltage, and the voltage is compared by a comparator or an inverter, so that there is not much choice to control the comparator with existing circuits, because current and voltage are directly related to the process parameters. Now in the present invention, there is one more converting step to read the data, such that the current of the cell transistor discharges the bit line, the segment read circuit detects the voltage of the bit line, and the voltage data is converted to time difference by the block read circuit. Furthermore, the block read circuit is tunable to differentiate low threshold data and high threshold data more effectively. As a result, the read output of the block read circuit is reached to the latch circuit through the returning data path. In doing so, the low threshold data is reached to the latch circuit earlier, while high threshold data is rejected by the locking signal. There are many advantages to adopt the time-domain sensing scheme, so that the sensing time is easily controlled by the tunable delay circuit, which compensates wafer-to-wafer variation as well. Furthermore, this circuit technique is also useful for small cell transistors, such as nanocrystal memory and single electron memory including quantum dot, because small cell transistors can flow very low current. Moreover, the bit line can be divided into a small piece for reducing parasitic capacitance of the bit line, which enables the time-domain sensing scheme can differentiate very low current difference with lightly loaded bit line.

One more advantage is that the time-domain sensing scheme is useful for reducing the cell current difference between the turn-on current of the low threshold data and the turn-off current of the high threshold current. In the conventional flash memory, there is at least several 1000 times difference between the turn-on current and the turn-off current, in order to read the cell transistor with existing comparator or an inverter. In the present invention, the current difference can be reduced, for example, to several 100 times instead of several 1000 times, as long as the distribution of the difference is stable at a given fabrication process for manufacturing.

Furthermore, any type of floating gate device can be used as a storage device, such as MNOS (Metal-Nitride-Oxide Semiconductor), SONOS (Silicon-Oxide-Nitride-Oxide Semiconductor), MAOS (metal-alumina-oxide-semiconductor), MAS (metal-alumina-semiconductor), nanocrytal memory including nanocrystal layer, single electron memory including quantum dot, and so on. Still furthermore, the fabrication method is compatible with the conventional planar CMOS process with no additional steps.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIGS. 11A, 11B and 11C illustrate example layouts for the segment read circuit and the memory cell array, according to the teachings of the present invention.

FIG. 12A illustrates a related circuit schematic for explaining a cross sectional view. FIG. 12B illustrates a cross sectional view for the segment read circuit and the memory cell array, according to the teachings of the present invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1A:
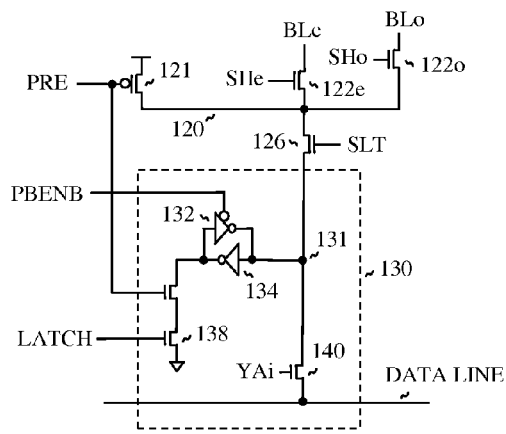
FIG. 1A illustrates a sensing circuit for NAND flash memory as a prior art.
Figure 1B:
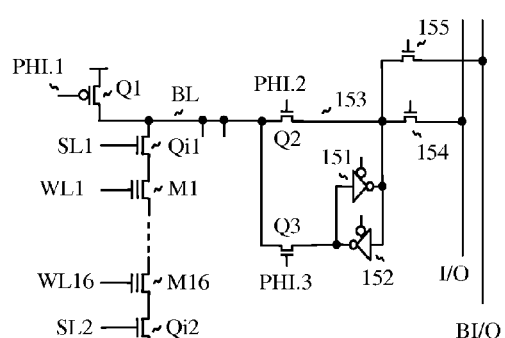
FIG. 1B illustrates another sensing circuit for NAND flash memory as a prior art.
Figure 2:
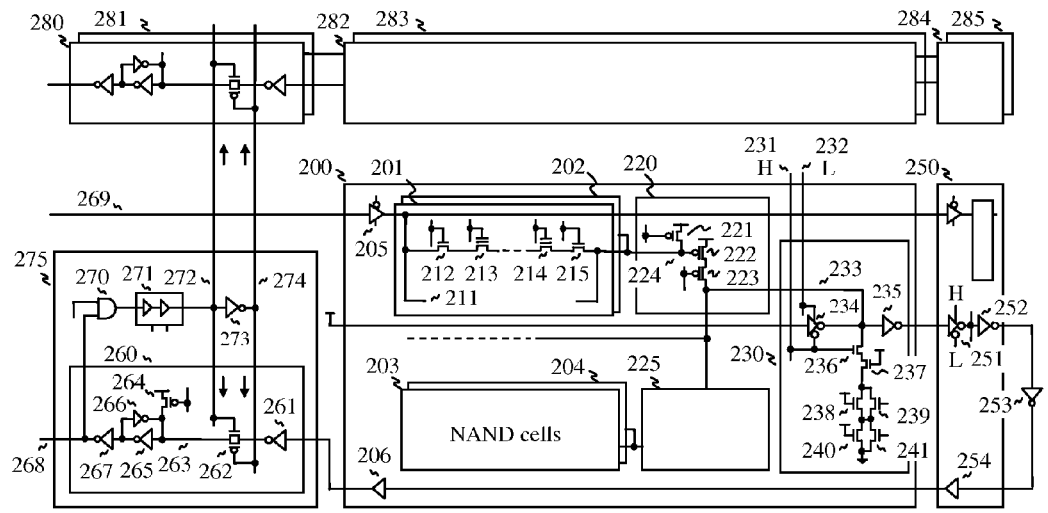
FIG. 2 illustrates the time-domain sensing scheme including multi-divided bit line architecture, according to the teachings of the present invention.

The present invention is directed to NAND type floating gate memory, as shown in FIG. 2, wherein a memory block 200 is composed of multiple memory cell arrays 201, 202, 203 and 204, segment read circuits 220 and 225, a write buffer 205 and a read buffer 206. The write buffer 205 receives data input 269, and the read buffer 206 receives read output from cell transistor through read path including inverters 251, 252, 253 and non-inverting buffer 254. The memory cell array 201 comprises a write select transistor 212, a read select transistor 215, and cell transistors (memory cell) 213 and 214. A segment write line 211 is connected to the write buffer 205 and a segment read line 224 is connected to a segment read transistor 222 of the segment read circuit 220. A segment pre-charge transistor 221 is connected to the segment read line 224, and a segment selector transistor 223 is connected to the segment read transistor 222. And the segment select transistor 223 is connected to a block read line 233 of a block read circuit 230. Thereby the segment read line 224 is lightly loaded with multi-divided bit line architecture, and the block read line 233 is driven by the segment read circuit 220 which is much stronger than the cell transistor. When the low threshold data is stored in the charge trap region of a selected cell transistor, the segment read line 224 is discharged by the cell transistor during read cycle. Otherwise the segment read line 224 is not discharged by the cell transistor when the high threshold data is stored. When the memory block 200 is selected, tri-state inverter 234 in the block read circuit 230 is turned off by the block selector signal 231 (high) and 232 (low), while the tri-state inverter 251 in the unselected block 250 is turned on in order to bypass the read output. Simultaneously, the pull-down transistors 236, 237, 238 and 240 are turned on for the selected block, but the pull-down strength is much weaker than the pull-up strength of the segment read circuit 220, where the tunable pull-down transistor 238 and 240 are selected by transistors 239 and 241 respectively, so that an amplifier is composed of the segment read circuit as an amplify device and the pull-down transistor as active load. For example, the pull-down strength is one-tenth of the pull-up strength in order to obtain high gain. As a result, the block read line 233 is pulled up near supply voltage, thus output of read buffer 235 is changed to low by the block read line 233, and which output is transferred to next block 250, which is read data "0" for reading low threshold data, but the output of the read buffer 235 keeps high when reading data "1" from high threshold data because the segment read line 224 keeps pre-charge state, which does not turn on the PMOS read transistor 222. Thus the block read line 233 remains at low with the weak pull-down devices 236, 237, 238 and 240.

And then, the read output from the cell transistor is transferred to a latch circuit 260 through a read path including the read buffer 235, tri-state inverter 251, inverters 252 and 253, and buffers 254 and 206. In particular, the read path includes a returning path, so that the arriving time to the latch circuit is almost same regardless of location of the selected cell transistor, as long as the word line receives the address inputs from the latch circuit side and delay time of the address inputs include similar to the read path including multiple buffers (not shown). Furthermore, the returning path is inverted by inverter 253 which compensates the strength of the rise time and the fall time of the buffers. Without inverting, the long read path includes only rising delay, because the rise time and the fall time are not equal in CMOS buffer.

In the latch circuit 260, the read output changes the latch node 263 and output 268 to low from high through inverters 261, 265 and 267 because the latch node 263 is pre-charged to high by PMOS 264 before activated. After then, the read output is stored in the latch node 263 with cross coupled inverters 265 and 266. And the output 268 changes AND gate 270 to low, so that the transmission gate 262 is locked by signal 272 and 274 which are transferred from the output 268 through a tunable delay circuit 271 and inverter 273. Simultaneously, latch circuits 280 and 281 are also locked by the signal 272 and 274, where latch circuits 280 and 281 are composed of same circuits as the latch circuit 260. In doing so, the output 268 serves as a reference signal, which is generated by the reference memory cells, such as the cell transistors 213 and 214 which store low threshold data. Adding delay circuit 271, the reference signal serves as a locking signal, where the delay circuit is tunable for differentiating low threshold data and high threshold data, more effectively. Thus, the latch circuit and the delay circuit configure a latch control circuit 275 in order to generate the locking signal. More detailed delay circuit will be explained as below. And the AND gate 270 is used to generate the reference signal even though one of reference cells is failed, where more than one reference column is added to the memory block even though the drawing illustrates only one reference memory column 200 including the latch circuit 260. In this manner, the read outputs from the main memory array 282, 283, 284 and 285 are stored to the latch circuit 280 and 281 by the locking signals 272 and 274. Furthermore, the read access time is faster than that of the conventional floating gate memory, such that multi-divided bit line architecture is introduced in order to reduce the parasitic capacitance of local bit line, and number of series cells can be also reduced to reduce series resistance through the cell transistors.

Figure 3A:
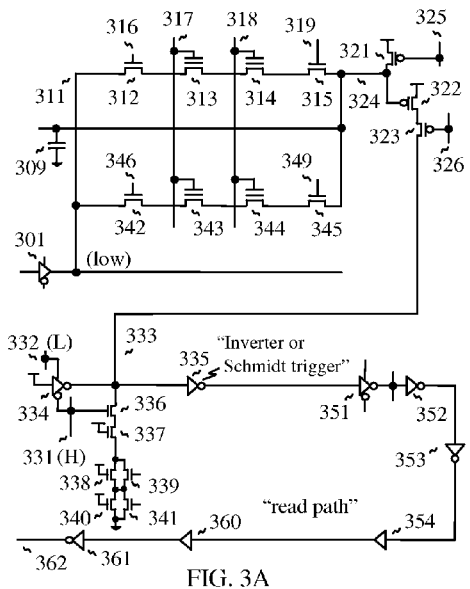
FIG. 3A illustrates a simplified read circuit.

In FIG. 3A, a simplified read circuit is illustrated in order to explain the read operation. The pre-charge transistor 321 is controlled by pre-charge bar (PB) signal 325, and the pre-charge transistor 321 is connected to the segment read line (SRL) 324. The segment read line 324 is connected to the segment read transistor 322. The cell transistors 313 and 314 are serially connected, and the write select transistor 312 is connected to the segment write bit line 311, and the read select transistor 315 is connected to the segment read line (SRL) 324. The other cell transistors 343 and 344 are serially connected, the write select transistor 342 is connected to the segment write line 311, the read select transistor 345 is connected to the segment read line 324, and control gate signals 317 and 318 are connected the cell transistors respectively, where the segment write line 311 is lowered to ground by the write buffer 301 during read operation. The segment read line 324 controls the PMOS segment read transistor 322, and the segment select transistor 323 is connected to the PMOS segment read transistor 322, which transistor is connected to the block read line 333. Hence, an inverting read buffer 335 receives the cell data through the block read line 333, and then the read output is transferred to output node (DO) 362 through a returning read path including inverting buffers 351, 352, 353 and 361, and non-inverting buffers 354 and 360. Alternatively, the inverting read buffer 335 can be a Schmidt trigger to reject low voltage, which circuit can be composed of the conventional circuit techniques as published U.S. Pat. Nos. 4,539,489 and 6,084,456, thus detailed schematic is not described in the present invention, wherein an inverting type Schmidt trigger can be used for this application. A tri-state inverter 334 is turned off for the selected block while another tri-state inverter 351 is turned on to bypass the read output for the unselected block, and the pull-down transistors 336, 337, 338 and 340 are turned on but the pull-down strength is much weaker than pull-up strength of PMOS 322 and 323, where the select transistor 339 and 341 can adjust the pull-down strength.

Figure 3B:
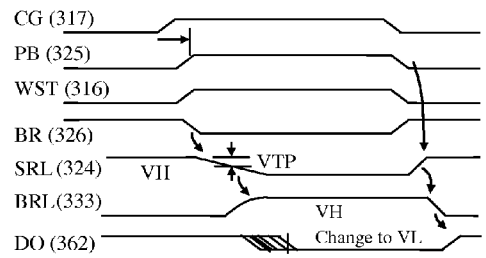
FIG. 3B illustrates read timing diagram for low threshold cell transistor.

Referring now to FIG. 3B in view of FIG. 3A, detailed read timing for low threshold data is illustrated, wherein the pre-charge bar (PB) signal 325 is raised to read data, and the block read (BR) signal 326 is lowered to turn on the segment select transistor 323. Then the control gate (CG) signal 317 is raised to predetermined voltage to measure the selected cell transistor 313, but the unselected cell transistor 314 is bypassed by raising VPASS voltage to the gate 318, which voltage is enough high to turn on the high threshold cell transistor. During read operation, the read select transistor 315 is turned on by the gate voltage 319 and the write select device 312 is also turned on by the gate voltage 316. Hence the segment read line 324 is discharged through the cell transistor 313 when low threshold data is stored in the charge trap region. And the unselected segment read transistor 345 is turned off with gate 349 at low, and the unselected segment write transistor 342 is turned off with gate 346 at low, and there is a leakage current with turn-off current, but the leakage is negligible in this application. Discharging the segment read line (SRL) 324, the block read line (BRL) 333 is pulled up near the supply voltage by the pull-up transistors 322 and 323, because the pull-up transistors are much stronger than the pull-down transistors 336, 337, 338 and 340. And more memory arrays may be connected to the segment read line 324, which increases parasitic capacitance 309 equivalently, and also leakage current may be increased through multiple memory arrays, even though those arrays are turned off. Thus, the turn-on current of the selected cell transistor 313 should be much higher than the total leakage of the unselected memory arrays.

Pulling up the block read line 333, the output of read buffer 335 is changed to low from high, and which output is transferred to output node (DO) 362 through the returning read path including inverting buffers 351, 352, 353 and 361, and non-inverting buffers 354 and 360. During read operation, there is no phase control signal such that the cell data is immediately transferred to the output node 362 through the read path. After the pre-charge signal 325 is de-activated, the segment write transistor 316 is asserted to high at last, in order to discharge the segment read line 324 through cell transistors. More specifically, the segment read transistor 322 waits until the segment write transistor 316 is asserted to high because there is no current path for the segment read line 324. Hence, read control is relatively simple, which also realizes fast access with lightly loaded bit line. Furthermore, the segment read transistor 324 can include lower threshold voltage MOS transistor than that of other peripheral circuits, in order to achieve fast discharging the segment read line. After reading the data, the pre-charge bar (PB) signal 325, the control gates 317 and 318, and other control signals are returned to pre-charge state or standby mode, as shown FIG. 3B.

Figure 3C:
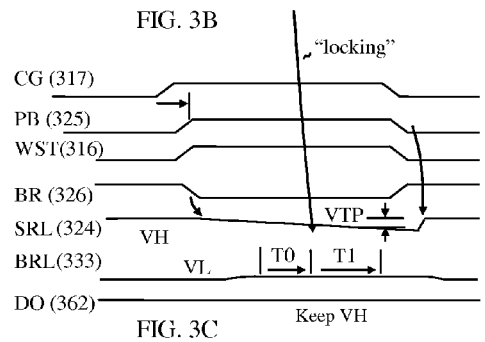
FIG. 3C illustrates read timing diagram for high threshold cell transistor, according to the teachings of the present invention.

Referring now to FIG. 3C in view of FIG. 3A, detailed read timing for high threshold data is illustrated, wherein the pull-up transistors 322 and 323 in the segment read circuit do not pull up the block read line 333 because the segment read line (SRL) 324 is not discharged by the cell transistor when the high threshold data is stored in the charge trap region. Thereby, the block read line 333 keeps low with weak pull-down transistors 336, 337, 338 and 340, thus the output (DO) 362 keeps high. However, the segment read line (SRL) 324 is slowly discharged by the turn-off current of the cell transistor 313, leakage current of the unselected transistor 345 and other unselected memory array. When the segment read line 324 is reached to the threshold voltage of the PMOS transistor 322, the PMOS transistor 322 starts to pull up the block read line 333 through the segment select transistor 323. Hence, the block read line 333 is gradually pulled up, which changes the read buffer 335. As a result the read output (DO) 362 is flipped to low. In order to avoid the false flip with the leakage current, the pull-down strength can be adjusted by selecting the transistors 339 and 341. And the reference signal is generated by low threshold data with delay time as shown T0 in FIG. 3C, so that the timing margin T1 is defined to reject the high threshold data. In this manner, the time-domain sensing scheme can differentiate the low threshold data and high threshold data within the time domain. This is obvious that the discharge current "i" through the segment read line is defined as i=C*dv/dt, which is converted to dt=C*dv/i. Thereby, the discharge time "dt" is proportional to the discharge current inversely where the segment read line capacitance "C" and the discharge voltage "dv" are fixed to turn on the segment read transistor 322, which means that the discharge current is converted to discharge time through the segment read circuit and the block read circuit. Hence the current difference between turn-on current (Ion) and turn-off current (Ioff) is directly converted to time difference. And the reference signal is used to generate a locking signal to sense high threshold data in the time domain.

Figure 4A:
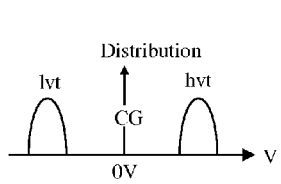
FIG. 4A illustrates a distribution graph for binary level cell transistors.
Figure 4B:
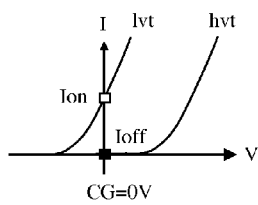
FIG. 4B illustrates I-V curve of the binary level cell transistor.
Figure 4C:
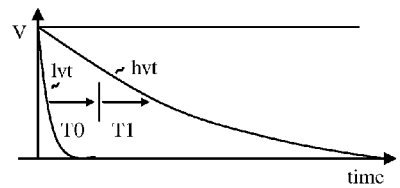
FIG. 4C illustrates discharge times for low threshold data and high threshold data.
Figure 4D:
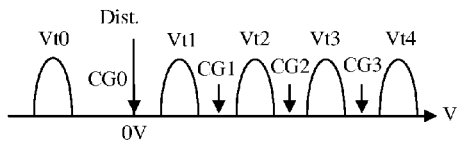
FIG. 4D illustrates a distribution graph of the multi-level cell transistors, according to the teachings of the present invention.

In FIG. 4A, a distribution graph for binary level cell transistor is illustrated, wherein the distribution of the low threshold data of the cell transistor "lvt" is lower than that of the high threshold data of the cell transistor "hvt". Hence, the current flow of the "lvt" cell transistor "Ion" is higher than that of the "hvt" cell transistor "Ioff" at a given control gate voltage (CG=0V), as shown in FIG. 4B. And in FIG. 4C, discharge times for low threshold data and high threshold data are illustrated, such that discharge time of high threshold data is defined as T0+T1. Thereby, the best locking time is regarded as T0, only if T0 is around middle between low threshold data and high threshold data in the discharge time. However, it is not necessary that T0 is middle when the "Ioff" current is very low. Thus, the delay time T0 should be optimized after collecting statistical data of the distribution of the cell transistors. In FIG. 4D, a distribution graph of the multi-level cell transistor is illustrated, wherein the threshold voltage Vt0, Vt1, Vt2, Vt3, and Vt4 are defined for storing four-level data, and the control gate voltage CG0, CG1, CG2, and CG3 are forced in order to measure each level of data, respectively.

Figure 5:
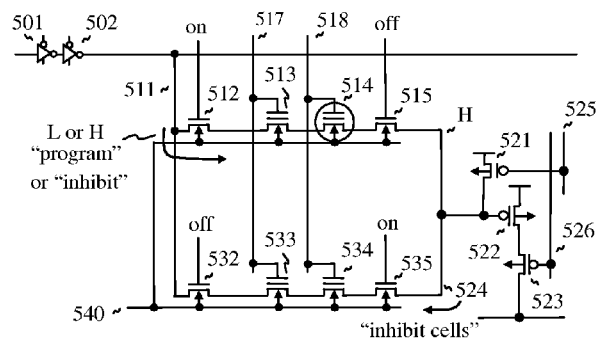
FIG. 5 illustrates a circuit schematic for programming, according to the teachings of the present invention.

In FIG. 5, a simplified circuit schematic for programming is illustrated, In order to program the cell transistor (to store high threshold data), the write buffer (501 and 502) is activated, which buffer drives the segment write line 511 to low (0V), the write select transistor 512 is turned on and gate 518 of the selected cell transistor 514 is selected by forcing a predetermined program voltage (for example, 18V) while gates 517 of the unselected cell transistors 513 and 533 are forced to lower voltage (for example, 10V) than program voltage. And more cell transistors can be serially connected even though two cell transistors are shown in the drawing for ease of understanding. During program, the read select transistor 515 is turned off to cut the current path, but the other read select transistor 535 is turned on to force the supply voltage (for example, 3.3V), thus another unselected cell transistor 534 is not programmed, but the unselected write select transistor 532 is turned off. In order to force the segment read line 524 to the supply voltage, the pre-charge transistor 521 is turned on by lowering the pre-charge control signal 525, which means that the segment read circuit keeps the pre-charge state during program. Hence the segment read transistor 522 is turned off because the segment selector transistor 523 is turned off by maintaining the segment selector signal 526 to high. The body 540 is forced to low (0V) during program. On the contrary, to inhibit programming the selected cell transistor (to keep low threshold data), the write buffer 502 keeps high. Thus, the selected cell transistor 514 keeps low threshold data.

Figure 6A:
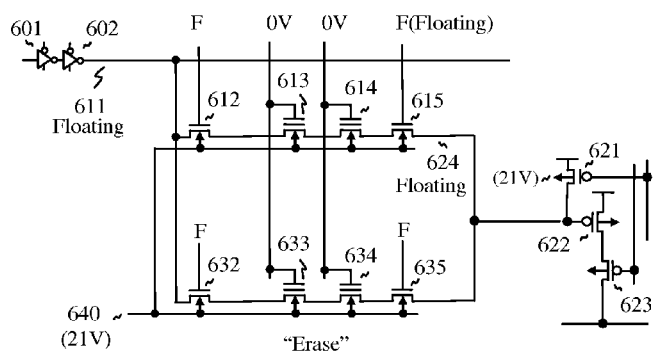
FIG. 6A illustrates a circuit schematic for erasing.
Figure 6B:
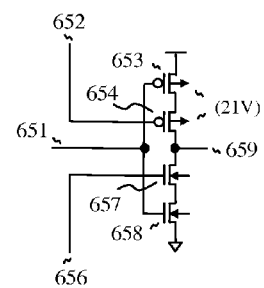
FIG. 6B illustrates tri-state (clocked) inverter, according to the teachings of the present invention.

In FIG. 6A, a simplified circuit schematic for erasing is illustrated, wherein the body 640 is forced to high voltage (for example, 21V), and the segment write line 611 is floating. The segment write line 611 is driven by tri-state inverter chains 601 and 602. More detailed schematic is illustrated in FIG. 6B, such that the tri-state inverter is composed of PMOS 653 and 654, NMOS 657 and 658. The input 651 is asserted to PMOS 653 and NMOS 658, and the output 659 is generated from PMOS 654 and NMOS 657. During read and write (program), the tri-state inverters are activated to transfer the received input, but the tri-state inverters are de-activated during erase, which is controlled by the enable signal 652 and 656. During erase operation, the segment read line 624 is floating as well, with turning off the pre-charge transistor 621. In order to float the segment read line 624, n-well of the PMOS pre-charge transistor 621 should be high voltage (for example, 21V), which prevent forward bias from the segment read line 624 to the n-well potential (21V). The n-well potential is simply controlled because the n-well of the segment read circuit is separately formed from the body (p-substrate) of the NMOS cell transistors. During erase, the gate voltage of the cell transistors are forced to low (0V), the selector signals 612, 615, 632 and 635 are floating, and the other circuits in the segment read circuit 622 and 623 are turned off.

Figure 7:
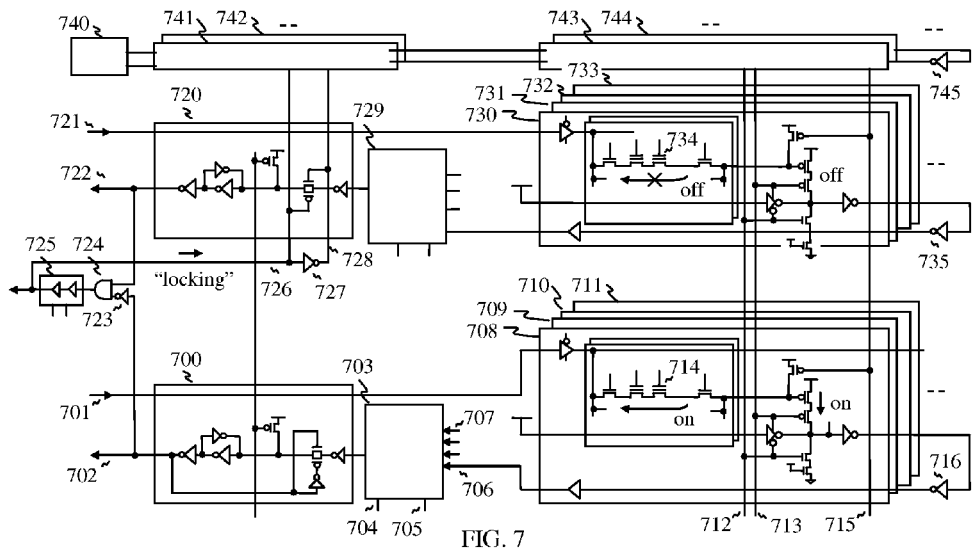
FIG. 7 illustrates a circuit schematic for reading multi-level cell transistor, according to the teachings of the present invention.

In FIG. 7, a circuit schematic for reading multi-level cell transistor is illustrated. In order to read multi-level data from the cell transistor, multiple reference signals are used to measure each level, wherein the memory cell 714 in the memory block 708 stores the first threshold data (Vt0 in FIG. 4D), the memory cells in the memory block 709 stores the second threshold data (Vt1), the memory cells in the memory block 710 stores the third threshold data (Vt2), the memory cells in the memory block 711 stores the fourth threshold data (Vt3), in order to measure four level threshold data. More levels can be measured only if more reference signals are generated by each reference cell storing the related threshold data, even though the drawing depicts only four memory blocks for measuring four levels. When the first level is measured, the first reference signal is selected by the block selector signals 712 and 713, and pre-charge signal 715 is released to high. Thereby, selected cell transistor 714 is turned on, which output is transferred to output 702 of the latch 700 through the selector circuit 703, an inverter 716 and buffer. When the memory block 708 is selected, the selector circuit 703 selects the output 706 with the selector input 704 and 705, where more detailed operation of the selector circuit 703 will be explained as below in FIG. 8D. Thus, the output 706 from the memory block 708 is bypassed the selector circuit 703 and reached to the latch circuit 700. In doing so, the output 706 changes the latch output 702, which signal locks the latch (700) itself. And then the output 702 changes the locking signal 726 through an inverter 723, AND gate 724 and a tunable delay circuit 725, so that other latches 720, 741 and 742 are locked by the locking signals 726 and 728 (inverted signal of 726 with inverter 727). While low threshold cell transistor 714 generates a reference signal, cell transistor 734 storing the second threshold data (Vt1) in the memory block 730 is turned off. Hence, inverter 735 keeps low and the output 722 keeps high.

One aspect of using two reference cells for generating a reference signal is that the reference signal can be used for characterizing the relation between the first threshold data (in the cell 714) and the second threshold data (in the cell 734). Thereby the AND gate 724 always compares the output data from low threshold data and high threshold data. As a result, the locking signal 726 is generated only if two reference cells generate each signal correctly. Otherwise, the locking is not generated. For example, the second threshold (Vt1) cell transistor 734 stores negative charges in the charge trap region, which cell transistor usually turned off when reading the first threshold data (Vt0). However, the cell transistor 734 may be turned on if the stored charges in the charge trap region are reduced after frequent access. And the first threshold cell transistor 714 is usually turned on when reading, but the cell transistor may be turned off if some charges are trapped in the charge trap region after frequent access. In either case, the locking signal 726 is not generated. By measuring the locking signal or reference signal, the system can check whether the memory block works correctly or not.

For measuring the second level, the memory block 709 and 731 are selected during next cycle, such that the second voltage level (CG1) is asserted to the memory block 709, and the third voltage level (CG2) is asserted to the memory block 731 where the memory block 709 stores the second threshold data (Vt1) and the memory block 731 stores the third threshold data (Vt2). Thus, the locking signal 726 is generated as long as the cell transistors work correctly. And the selector circuits 703 and 729 select the signals from the memory block 709 and 731, respectively. In the similar manner, the third level is measured by the memory block 710 (storing the third threshold data) and the memory block 732 (storing the fourth threshold data). And the fourth level is measured by the memory block 711 (storing the fourth threshold data) and the memory block 733 (storing the fifth threshold data), consecutively. Thus, the main memory blocks 743 and 744 are measured by using the locking signals for each level, respectively. And the output data is transferred to the latch circuits 741 and 742 through inverter 745. The latched output is shifted to shifter register 740, where the shifter register 740 is composed of conventional flip-flop circuits. Hence, the detailed schematic is not illustrated in the present invention.

Figure 8A:
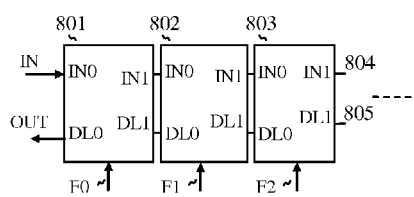
FIG. 8A illustrates a tunable delay circuit.

In FIG. 8A, more detailed a tunable delay circuit as shown 725 in FIG. 7 is illustrated, wherein multiple delay units 801, 802 and 803 are connected serially, the first delay unit 801 receives input IN and generates output OUT, the second delay unit 802 is connected to the first delay unit, and the third delay unit 803 is connected to the second delay unit 802 and generates outputs 804 and 805, and so on. Each delay unit receives a fuse signal, such that the first delay unit receives F0, the second delay unit receives F1, and the third delay unit receives F2. And more detailed delay unit is illustrated in FIG. 8B, wherein the delay unit 810 receives an input IN0 and a fuse signal Fi, thus the fuse signal Fi selects output from the input IN0 or input DL1, so that a transfer gate 811 is turned on when the fuse signal Fi is low and output of inverter 813 is high, otherwise another transfer gate 812 is turned on when the fuse signal Fi is high and output of inverter 813 is low to bypass DL1 signal. Inverter chain 814 and 815 delays IN0 signal for the next delay unit, where more inverter chains or capacitors can be added for the delay even though the drawing illustrates only two inverters.

Figure 8C:
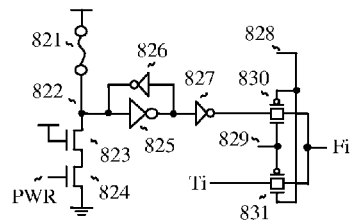
FIG. 8C illustrates a related fuse circuit of the tunable delay circuit.
Figure 8B:
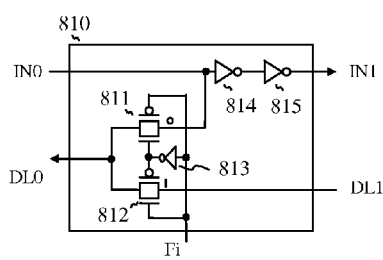
FIG. 8B illustrates a delay unit of the tunable delay circuit.

In FIG. 8C, a related fuse circuit of the tunable delay circuit as shown in FIG. 8A is illustrated, wherein a fuse 821 is connected to a latch node 822, a cross coupled latch including two inverters 825 and 826 are connected to the latch node 822, pull-down transistors 823 and 824 are serially connected to the latch node 822 for power-up reset. Transfer gate 830 is selected by a select signal 829 (high) and another select signal 828 (low) in order to bypass the latch node 822 through inverter 825 and 827. In doing so, fuse data is transferred to output node Fi, otherwise, test input Ti is transferred to Fi when a transmission gate 831 is turned on.

Figure 8D:
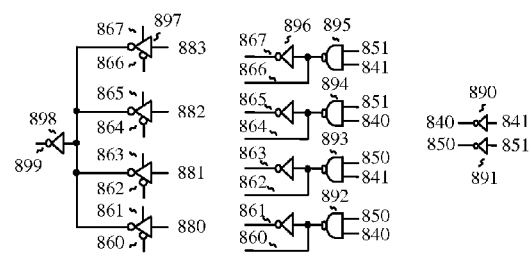
FIG. 8D illustrates a related selector circuit of FIG. 7, according to the teachings of the present invention.

In FIG. 8D, detailed selector circuit as shown 703 and 729 in FIG. 7 is illustrated. In order to select a signal from four data inputs 880, 881, 882, and 883, one of four tri-state inverters are selected, respectively, such that input 880 is transferred to output node 899 through inverter 898 when selector signal 860 is low and another selector signal 861 is high to turn on the related tri-state inverter. In the similar manner, input 881 is transferred to output node 899 through inverter 898 when selector signal 862 is low and another selector signal 863 is high to turn on the related tri-state inverter. Input 882 is transferred to output node 899 through inverter 898 when selector signal 864 is low and another selector signal 865 is high to turn on the related tri-state inverter. And input 883 is transferred to output node 899 through inverter 898 when selector signal 866 is low and another selector signal 867 is high to turn on the related tri-state inverter 897. When a tri-state inverter is selected, the other tri-state inverters are not selected, such that one of four-input-NAND gates 892, 893, 894 and 895 is asserted to low by selector inputs 841 and 851. Selector inputs 841 and 851 are inverted to generate negated outputs 840 and 850 by inverter 890 and 891 respectively, in order to decode the NAND gates 892, 893, 894 and 895, respectively. And inverter 896 and others generate inverting signals 861, 863, 865 and 867 to select the related tri-state inverters to bypass the related data inputs.

Figure 9:
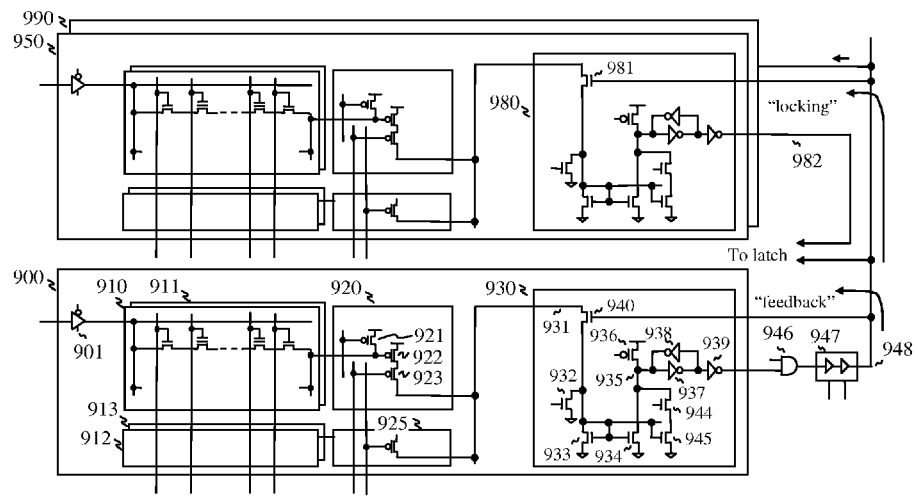
FIG. 9 illustrates alternative configuration including a current mirror as a block read circuit in a memory block, according to the teachings of the present invention.

In FIG. 9, alternative configuration including a current mirror as a block read circuit in a memory block is illustrated. A memory block 900 includes memory arrays 910, 911, 912 and 913, a write buffer 901, segment read circuit 920 and 925, and a block read circuit 930. The segment read circuit 920 is connected to memory cell arrays 910 and 911, which arrays are the same circuit as shown 201 in FIG. 2. The block read circuit 930 is composed of a current mirror circuit and a latch circuit, wherein the current mirror is composed of a pull-down transistor 933 and a current mirror (repeater) 934, and the latch circuit is composed of two cross coupled inverters 937 and 938. Additionally, the pull-down strength of the current repeater can be tunable with multiple repeaters including NMOS 945 which is selected by NMOS switch 944, and more current repeaters can be added even though the drawing illustrates only one selectable repeater. The pull-down transistor 933 is connected to the segment read circuit 920 through the block read line 931 and NMOS switch 940, and a pre-charge transistor 932. When low threshold data is read, the segment read circuit 920 (or the segment read circuit 925 connecting memory array 912 and 913) pulls up the pull-down transistor 933 while the switch 940 is turned on and the pre-charge transistor 932 is turned off. Hence, the latch node 935 is changed to low from the pre-charged voltage, where the pre-charge transistor 936 is turned off during read. By lowering the latch node 935, the inverters 937 and 939 are changed, and the logic states are stored in the latch circuit including two cross coupled inverters 937 and 938. And inverter output signal 939 is transferred to AND gate 946. Furthermore, the AND gate 946 receives multiple signals from other memory block (not shown), so that the signal is generated only if at least one reference cell works correctly, which signal serves as a reference signal. Then a tunable delay circuit 947 adds a delay time for optimizing the reference signal. Thus, the tunable delay circuit output 948 serves as a locking signal to lock the latch circuits 980 in the main memory block 950 and other memory block 990, where the main memory blocks 950 and 990 include same configuration as the memory block 900, except the stored data in the reference memory block 900 is low threshold data to generate the reference signal. Thus the main memory blocks receive the locking signal 948. In doing so, the output 982 is determined by locking transfer transistor 981 with the locking signal 948. Advantage of using current mirror as a block read circuit is that the current path through the segment read circuit is short by a direct feedback of the output of the current mirror, which reduces current consumption with short feedback path during read operation. This configuration is more useful when the memory block is relatively small.

Figure 10:
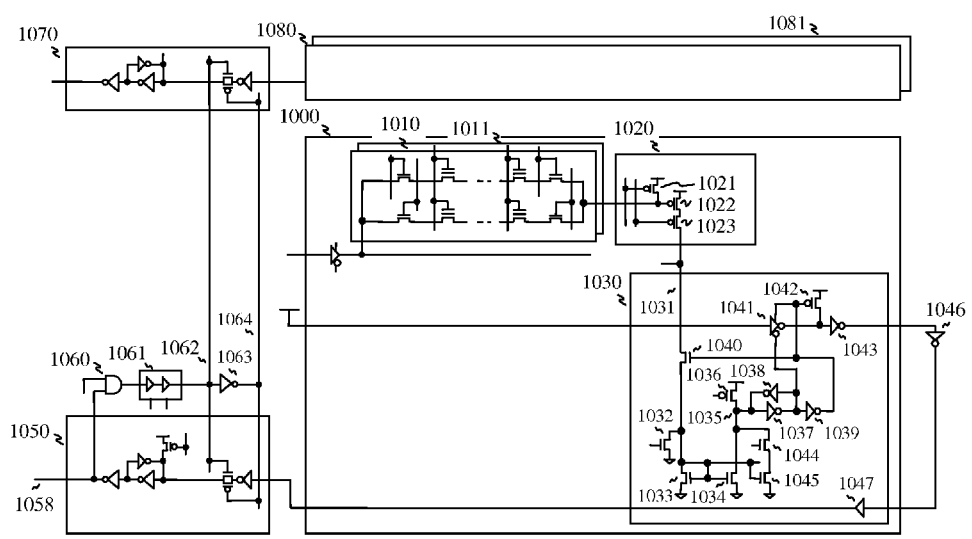
FIG. 10 illustrates alternative configuration including a current mirror as a block read circuit in a memory bank, according to the teachings of the present invention.

In FIG. 10, alternative configuration including a current mirror as a block read circuit in a memory bank including multiple memory blocks is illustrated. Memory blocks 1000, 1080 and 1081 configure a relatively big memory bank. The memory block 1000 includes memory arrays 1010 and 1011, a segment read circuit 1020, and a block read circuit 1030. The segment read circuit 1020 including pre-charge transistor 1021, read transistor 1022 and select transistor 1023, is connected to memory cell arrays 1010 and 1011, which arrays are the same circuit as shown 201 in FIG. 2. The block read circuit 1030 is composed of a current mirror circuit and a latch circuit, wherein the current mirror is composed of a pull-down transistor 1033 and a current repeater 1034, and the latch circuit is composed of two cross coupled inverters 1037 and 1038. Additionally, the pull-down strength of the current repeater can be tunable with multiple repeaters including NMOS 1045 which is selected by NMOS switch 1044. The pull-down transistor 1033 is connected to the segment read circuit 1020 through the block read line 1031 and NMOS switch 1040, and a pre-charge transistor 1032. When low threshold data is read, the segment read circuit 1020 pulls up the pull-down transistor 1033 while the switch 1040 is turned on and the pre-charge transistor 1032 is turned off. Hence, the latch node 1035 is changed to low from the pre-charged voltage, where the pre-charge transistor 1036 is turned off during read. By lowering the latch node 1035, the inverters 1037 and 1039 are changed, and the logic state is stored in the cross coupled inverters 1037 and 1038. Then the latched (high) data in the inverter 1037 disables a tri-state inverter 1041 and the latched (low) data in the inverter 1039 turns on PMOS 1042. Turning on PMOS 1042, output of inverter 1043 is changed to low from high. And the output is transferred to a latch circuit 1050 through inverter 1046 and buffer 1047, which changes latch output 1058 to low. And then, the output 1058 changes AND gate 1060 to low, which signal is transferred to a delay circuit 1061. As a result, a negative locking signal 1062 is generated and a positive locking signal 1064 is inverted by an inverter 1063 to lock latch circuit 1050 and 1070. Advantage of using current mirror as a block read circuit is that the current path through the segment read circuit is directly cut off by its own feedback of the output of the current mirror, which reduces more current consumption during read operation with very short feedback path. Moreover, there are still many alternative configurations. For example, the segment read circuit includes a pre-charge transistor and a read transistor with no select transistor (not shown), and the read transistor is directly connected to the block read line, which circuit equally works, but the block read line can not be shared by multiple columns.

Methods of Fabrication

The cell transistors can be formed on the surface of the wafer. And the steps in the process flow should be compatible with the current CMOS manufacturing environment as published as the prior arts, such as U.S. Pat. No. 6,720,579, and No. 7,183,174, and No. 7,157,332, and No. 7,141,474, and U.S. Pat. No. 6,337,293. In this respect, detailed manufacturing processes for forming the memory cells, such as width, length, thickness, temperature, forming method, or any other material related data, are not described in the present invention.

Referring now to FIGS. 11A, 11B and 11C, example layouts for the memory cell array and the segment read circuit are illustrated. In order to fabricate within the conventional planar CMOS process environment, one segment read circuit is matched with two memory arrays, wherein the base layers including p+ active region, n+ active region, poly gate region and contact region are shown in FIG. 11A. More specifically, write select transistors are controlled by poly gates 1101 and 1102, the memory cells are controlled by poly gates 1103, 1104 and 1105, and the read select transistors are controlled by poly gates 1106 and 1107. Additionally poly gate 1121 is segment select transistor which circuit is shown 1020 in FIG. 10, poly gate 1122 is segment read transistor which circuit is shown 1022 in FIG. 10, poly gate 1123 is pre-charge transistor which circuit is shown 1021 in FIG. 10. Furthermore, multiple cell transistors can be added in the memory cell array even though the drawing includes only six cell transistors for ease of understanding. In FIG. 11B, metal-1 layer and via-1 region are added, and segment read circuits are shown in order to illustrate the repeatability, such that the segment read transistor 1122 is placed in zigzag array because the pitch is limited. In FIG. 11C, metal-2 is added, wherein segment write line SWL0 and SWL1 are attached to the via-1 region, and segment read line SRL0 and SRL1 are attached to the related via-1 region.

Referring now to FIG. 12A, a related circuit schematic for explaining a cross sectional view for the memory array and the segment read circuit, wherein the memory cells 1202, 1203 and 1204 are serially connected, the write select transistor 1201 is connected to the memory cell 1202, the read select transistor 1206 is connected to the memory cell 1204 and the segment pre-charge transistor 1221, the segment read transistor 1222 is connected to the read select transistor 1206 through the segment read line 1224, and the segment select transistor 1223 is serially connected to the segment read transistor 1222. The block read line 1231 is connected to the segment select transistor 1223.

Referring now to FIG. 12B in view of FIG. 12A, a cross sectional view for the memory cell array 1200 and the segment read circuit 1220 is illustrated as an example implementation, wherein the memory cells are formed on the bulk 1227, the segment read circuit 1220 is formed on the n-well 1226, thus the segment read circuit is placed next to the memory cells on the planar structure, which can be fabricated in the conventional CMOS process environment with no additional process steps. In the memory cell array 1200, the poly gate 1201 serves as the write select transistor and the poly gate 1206 serves as the read select transistor. The memory cells 1202, 1203 and 1204 are placed in the middle region of the select transistors 1201 and 1206. In the segment read circuit 1220, transistor 1221 serves as the segment pre-charge transistor, transistor 1222 serves as the segment read transistor and transistor 1223 serves the segment select transistor. The metal-3 (block read line) 1231 is formed on the metal-2 line which is the segment read line 1224. And the segment read line 1224 is connected to the gate of the segment read transistor 1222 through metal-1 and contact region (not shown). The transistors are isolated by STI (Shallow Trench Isolation) region 1225.

And the charge trap regions in the memory cells 1202, 1203 and 1204 can be formed from various materials, such as polysilicon layer to form a flash memory, nitride layer to form an MNOS (metal-nitride-oxide semiconductor) memory and a SONOS (silicon-oxide-nitride-oxide semiconductor) memory, alumina to form a MAOS (metal-alumina-oxide-semiconductor) and a MAS (metal-alumina-semiconductor), nanocrystal layer to form a nanocrystal memory as published, U.S. Pat. No. 6,690,059. In particular, quantum dot can be used to form a single electron memory, such that one or two charge trap regions can be used to store charge as published, U.S. Pat. No. 5,960,266 and No. 7,105,874.

CONCLUSION

High speed NAND flash memory is realized, wherein time-domain sensing scheme effectively differentiates the low threshold data and the high threshold data with discharge time based on the cell current, because the cell current is converted to voltage difference by the segment read circuit and the voltage difference is converted to time difference by the block read circuit, such that an amplifier is composed of the segment read circuit as an amplify device and the block read circuit as load device in order to amplify the cell current. Thus, reference signal is generated by reference cells storing low threshold data, which is used to generate locking signal with tunable delay circuit to optimize delay time. The locking signal rejects high threshold data. Furthermore, the segment read line is lightly loaded by introducing multi-divided bit line architecture, which achieves fast access with fast discharge time of the read line. And the read circuits have no phase control signals, which does not require complex timing generator and achieves fast access time as well. Furthermore, the fabrication method is compatible with the conventional planar CMOS process with no additional steps.

While the description here has been given for configuring the memory circuit and structure, alternative embodiments would work equally well with reverse connection, such that p-channel cell transistor can be used, as published in U.S. Pat. No. 7,061,805. Thus, the memory cell configuration is also reversed, wherein the floating gate storage device includes p-type source and drain with n-type body. And also, the control signal polarities are reversed in order to control the reversely configured memory cell.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
 a memory cell, wherein a floating gate MOS transistor serves as a storage device storing low threshold data or high threshold data in a charge trap region between a body and a control gate;
 a memory cell array, wherein a plurality of memory cells is serially connected to configure NAND flash memory, one side of the memory cell array is connected to a segment write line through a write select transistor and the other side of the memory cell array is connected to a segment read line through a read select transistor;
 a segment write buffer driving the segment write line;
 a segment read circuit including a pre-charge transistor to set the segment read line, a read transistor to measure discharge time of the segment read line and a select transistor to activate the read transistor, where the select transistor configures a MOS output portion;
 a block read circuit connecting to the MOS output portion of the segment read circuit, which generates a time-dependant voltage output;
 a latch circuit storing the time-dependant voltage output of the block read circuit through a read path; and
 a main memory column, wherein a plurality of memory cell arrays having main memory cells is connected to the segment read circuit, the main memory cells store low threshold data or high threshold data, and a plurality of segment read circuits is connected to the block read circuit;
 a reference memory column, wherein a plurality of memory cell arrays having reference memory cells is connected to the segment read circuit, the reference memory cells store low threshold data, and a plurality of segment read circuits is connected to the block read circuit; and
 a latch control circuit, wherein a delay circuit receives a reference signal which is generated by the reference memory column, and the delay circuit delays the reference signal to generate a locking signal which locks the latch circuit before receiving high threshold data from the main memory column or the reference memory column.

2. The memory device of claim 1, wherein the segment write buffer includes two tri-state inverters.

3. The memory device of claim 1, wherein the segment read circuit includes the pre-charge transistor to set the segment read line, the read transistor to measure discharge time of the segment read line and the select transistor to activate the read transistor, where the read transistor includes a low threshold voltage MOS transistor.

4. The memory device of claim 1, wherein the block read circuit includes a pull-down device, a tri-state inverter and an inverter, more specifically, the pull-down device includes a transfer transistor in series with a fixed gate transistor, and the pull-down device is connected to a block read line which is connected to the segment read circuit, output of the tri-state inverter is connected to the block read line, which tri-state inverter is controlled by a block select signal, and input of the inverter is connected to the block read line.

5. The memory device of claim 1, wherein the block read circuit includes a pull-down device, a tri-state inverter and an inverter, more specifically, the pull-down device includes multiple transfer transistors in series with multiple fixed gate transistors, and the pull-down device is connected to a block read line which is connected to the segment read circuit, output of the tri-state inverter is connected to the block read line, which tri-state inverter is controlled by a block select signal, and input of the inverter is connected to the block read line.

6. The memory device of claim 1, wherein the block read circuit includes a pull-down transistor, a current mirror transistor and a pre-charge transistor, more specifically, a gate is shared with the pull-down transistor and the current mirror transistor, which gate is connected to the segment read circuit, and the pre-charge transistor is connected to a drain of the current mirror transistor.

7. The memory device of claim 1, wherein the block read circuit includes a pull-down transistor, a current mirror transistor and a pre-charge transistor, more specifically, and the current mirror transistor is adjustable with multiple select transistors, a gate is shared with the pull-down transistor and the current mirror transistor, which gate is connected to the segment read circuit, and the pre-charge transistor is connected to a drain of the current mirror transistor.

8. The memory device of claim 1, wherein the block read circuit includes a pull-down transistor, a current mirror transistor and a pre-charge transistor, more specifically, the pull-down transistor is connected to the segment read transistor of the segment read circuit through a transfer transistor, the current mirror transistor repeats the amount of the current through the pull-down transistor, the pre-charge transistor pre-charges a drain of the current mirror transistor, and a cross coupled inverter latch is connected to the drain of the current mirror transistor.

9. The memory device of claim 1, wherein the block read circuit includes a pull-down transistor, a current mirror transistor and a pre-charge transistor, more specifically, the pull-down transistor is connected to the segment read circuit through a transfer transistor, the current mirror transistor repeats the amount of the current through the pull-down transistor, the pre-charge transistor pre-charges a drain of the current mirror transistor, a cross coupled inverter latch is connected to the drain of the current mirror transistor, and the output of the cross coupled inverter latch controls the transfer transistor.

10. The memory device of claim 1, wherein the latch control circuit includes a delay circuit, the delay circuit receives reference signals from multiple reference memory columns through logic gate(s), and the delay circuit generates a locking signal which locks the latch circuit before receiving high threshold data from the main memory column or the reference memory column.

11. The memory device of claim 1, wherein the latch control circuit includes a tunable delay circuit with stored data or external test input, the delay circuit receives reference signals from multiple reference memory columns through logic gate (s), and the delay circuit generates a locking signal which locks the latch circuit before receiving high threshold data from the main memory column or the reference memory column.

12. The memory device of claim 1, wherein the latch control circuit receives a select output, which output is selected from multiple reference signals which are generated by multiple pairs of reference memory column in order to differentiate multi-level threshold data in the memory cell, wherein the first reference signal is generated from the first pair of the reference memory column when one reference memory column stores the first threshold data and another reference memory column stores the second threshold data when read, the second reference signal is generated from the second pair of the reference memory column when one reference memory column stores the second threshold data and another reference memory column stores the third threshold data, in this manner more reference signals are generated for measuring each level of threshold data.

13. The memory device of claim 1, wherein the latch circuit stores the time-dependant voltage output of the block read circuit through a read path, which read path includes a returning path from end of the main memory column or the reference memory column where there are multiple memory columns in a chip.

14. The memory device of claim 1, wherein the latch circuit stores the time-dependant voltage output of the block read circuit through a read path, which path includes an inverting returning path.

15. The memory device of claim 1, wherein the floating gate MOS transistor stores multi-level (multi-threshold) data in the charge trap region.

16. The memory device of claim 1, wherein the floating gate MOS transistor includes a charge trap region which includes polysilicon layer to form a flash memory, nitride layer to form an MNOS (metal-nitride-oxide semiconductor) memory and a SONOS (silicon-oxide-nitride-oxide semiconductor) memory, and alumina to form a MAOS (metal-alumina-oxide-semiconductor) and a MAS (metal-alumina-semiconductor).

17. The memory device of claim 1, wherein the floating gate MOS transistor includes a charge trap region which includes nanocrystal layer to form nanocrystal memory, and quantum dot to form a single electron memory.

18. The memory device of claim 1, wherein the floating gate MOS transistor includes n-type drain, n-type source and p-type body.

19. The memory device of claim 1, wherein the floating gate MOS transistor includes p-type drain, p-type source and n-type body.

* * * * *